(12) United States Patent
Ohki et al.

(10) Patent No.: US 8,969,919 B2
(45) Date of Patent: Mar. 3, 2015

(54) FIELD-EFFECT TRANSISTOR

(75) Inventors: Toshihiro Ohki, Kawasaki (JP); Naoya Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 314 days.

(21) Appl. No.: 13/312,623

(22) Filed: Dec. 6, 2011

(65) Prior Publication Data

US 2012/0074426 A1 Mar. 29, 2012

Related U.S. Application Data

(60) Division of application No. 12/365,446, filed on Feb. 4, 2009, which is a continuation of application No. PCT/JP2006/318572, filed on Sep. 20, 2006.

(51) Int. Cl.
*H01L 29/66* (2006.01)
*H01L 29/778* (2006.01)
(Continued)

(52) U.S. Cl.
CPC .......... *H01L 29/7787* (2013.01); *H01L 23/291* (2013.01); *H01L 29/66462* (2013.01);
(Continued)

(58) Field of Classification Search
CPC .............. H01L 29/7783; H01L 29/66462; H01L 21/28587
USPC ............. 438/167, 172; 257/24, 27, 192, 194, 257/E21.407, E29.246, E29.248, E29.249
See application file for complete search history.

(56) References Cited

U.S. PATENT DOCUMENTS 5,811,843 A 9/1998 Yamamoto
5,929,467 A 7/1999 Kawai et al. ................ 257/192
(Continued)

FOREIGN PATENT DOCUMENTS

CN 1431715 7/2003
JP 56-55056 5/1981
(Continued)

OTHER PUBLICATIONS

Japanese Office Action received on counterpart application No. 2008-53522 dated May 29, 2012 with partial English translation (4 pages).
(Continued)

*Primary Examiner* — David Vu
(74) *Attorney, Agent, or Firm* — Kratz, Quintos & Hanson, LLP

(57) ABSTRACT

A field-effect transistor includes a carrier transport layer made of nitride semiconductor, a gate electrode having first and second sidewall surfaces on first and second sides, respectively, an insulating film formed directly on the gate electrode to cover at least one of the first and second sidewall surfaces, first and second ohmic electrodes formed on the first and second sides, respectively, a passivation film including a first portion extending from the first ohmic electrode toward the gate electrode to cover a surface area between the first ohmic electrode and the gate electrode and a second portion extending from the second ohmic electrode toward the gate electrode to cover a surface area between the second ohmic electrode and the gate electrode, wherein the insulating film is in direct contact with at least the first and second passivation film portions, and has a composition different from that of the passivation film.

5 Claims, 13 Drawing Sheets

(51) Int. Cl.
*H01L 23/29* (2006.01)
*H01L 21/28* (2006.01)
*H01L 29/20* (2006.01)
*H01L 29/43* (2006.01)

(52) U.S. Cl.
CPC ....... *H01L21/28247* (2013.01); *H01L 29/2003* (2013.01); *H01L 29/432* (2013.01); *H01L 2924/13063* (2013.01)
USPC .................. 257/194; 257/192; 257/E29.246; 257/E29.248; 257/E29.249; 438/167; 438/172

(56) References Cited

U.S. PATENT DOCUMENTS

| | | | |
|---|---|---|---|
| 6,140,169 A * | 10/2000 | Kawai et al. | 438/197 |
| 6,274,893 B1 | 8/2001 | Igarashi | |
| 6,404,004 B1 | 6/2002 | Arimochi | |
| 6,521,961 B1 * | 2/2003 | Costa et al. | 257/402 |
| 7,002,189 B2 | 2/2006 | Kikkawa | 257/192 |
| 7,148,158 B2 | 12/2006 | Ozawa et al. | |
| 7,304,331 B2 | 12/2007 | Saito et al. | 257/192 |
| 7,973,335 B2 | 7/2011 | Okamoto et al. | |
| 2003/0127695 A1 | 7/2003 | Ozawa et al. | |
| 2005/0087766 A1 | 4/2005 | Kikkawa | |
| 2005/0124176 A1 | 6/2005 | Sugino | |
| 2007/0164326 A1 | 7/2007 | Okamoto et al. | |

FOREIGN PATENT DOCUMENTS

| | | |
|---|---|---|
| JP | 4-246836 | 9/1992 |
| JP | 8-162478 | 6/1996 |
| JP | 10-125901 | 5/1998 |
| JP | 2000-252299 A | 9/2000 |
| JP | 2001-223901 | 8/2001 |
| JP | 2003-100775 | 4/2003 |
| JP | 2003-115487 A | 4/2003 |
| JP | 2004-103744 | 4/2004 |
| JP | 2004-200248 | 7/2004 |
| JP | 2004-221325 | 8/2004 |
| JP | 2005-26325 A | 1/2005 |
| JP | 2005-136001 A1 | 5/2005 |
| JP | 2005-159244 A1 | 6/2005 |
| JP | 2006-032552 | 2/2006 |
| JP | 2006-120694 | 5/2006 |
| JP | 2006-147754 A | 6/2006 |
| JP | 2006-165018 A1 | 6/2006 |
| JP | 2006-278812 A1 | 10/2006 |
| WO | 2005/081304 | 9/2005 |
| WO | WO 2007/040160 A1 | 4/2007 |

OTHER PUBLICATIONS

Japanese Office Action mailed Sep. 10, 2013 in counterpart application No. 2011-249015 with English translation.
International Search Report for International Application No. PCT/JP2006/318572 dated Dec. 13, 2006.
Kikkawa T: "Highly Reliable 250 W GAN High Electron Mobility Transistor Power Amplifier" Japanese Journal of Applied Physics, Japan Society of Applied Physics,. Tokyo, JP, vol. 44, No. 7A, Jul. 1, 2005, pp. 4896-4901, XP001502263 ISSN: 0021-4922 "figure1".
Supplemental European Search Report dated Aug. 4, 2009.
First Notification of Office Action received on counterpart application No. 201110055876.2 from the State Intellectual Property Office of China dated Feb. 21, 2012 with English translation (8 pages).
Office Action; Mailing Date: Sep. 9, 2014; in Japanese Patent Application No. 2011-249015.
Office Action mailed Dec. 8, 2014, issued with respect to the corresponding European patent application No. 06798132.4.

* cited by examiner

FIELD-EFFECT TRANSISTOR

CROSS-REFERENCE TO RELATED APPLICATION

This application is a divisional of prior U.S. application Ser. No. 12/365,446, filed Feb. 4, 2009, which is a continuation of International Application No. PCT/JP2006/318572, filed on Sep. 20, 2006, with the Japan Patent Office, the entire contents of which are hereby incorporated by reference.

BACKGROUND

1. Field

The disclosures herein generally relate to semiconductor devices, and particularly relate to a high-power field-effect transistor using nitride semiconductor.

2. Description of the Related Art

Nitride semiconductors as typified by GaN, AlN, InN, and mixed crystals thereof have a large bandgap, and, for that reason, are utilized for a short-wavelength light emitting device. Since such nitride semiconductors having a large bandgap do not suffer breakdown even under high electrical field, the use of these semiconductors in application to high-power electronic devices has been attracting attention. Examples of such high-power electronic devices include a high-power field-effect transistor, especially a high-power HEMT.

Even for such a high-power electronic device utilizing nitride semiconductor, there has been a continuing effort to further reduce a gate leak current for the purpose of achieving an improved high-power performance.

FIG. 1 is a drawing showing the configuration of a high-power HEMT 10 using GaN as an electron transport layer according to the related art.

Referring to FIG. 1, the high-power HEMT 10 is formed on a semi-insulating SiC substrate 11. An electron transport layer 12 made of undoped GaN is epitaxially formed on the semi-insulating SIC substrate 11.

An electron supply layer 14 made of n-type AlGaN is epitaxially formed on the electron transport layer 12 with an undoped AlGaN spacer layer 13 intervening therebetween. Further, an n-type GaN layer 15 is epitaxially formed on the electron supply layer 14. In conjunction with the forming of the electron supply layer 14, 2-dimensional electron gas (2DEG) 12A is formed in the electron transport layer 12 over the interface with the spacer layer 13.

Further, a gate electrode 16 that includes an Ni electrode film 16A providing a schottky junction and a low-resistance Au film 16B stacked thereon is formed on the n-type GaN layer 15. Further, ohmic electrodes 17A and 17B including a Ti film and an Al film stacked one over the other are formed as a source electrode and a drain electrode, respectively, to be in direct contact with the electron supply layer 14 in such a manner as to be spaced apart from the gate electrode 16.

Moreover, a passivation film 18 made of SiN or the like is formed to cover the exposed surface of the n-type GaN layer 15. In the illustrated example, the passivation film 18 covers the ohmic electrodes 17A and 17B, and, also, is tightly attached to the sidewall surfaces of the gate electrode 16.

With the configuration described above, the electron supply layer 14 is covered by the n-type GaN layer 15 including no Al, so that the formation of interface state due to the oxidization of Al is suppressed on the surface of the electron supply layer 14. This serves to reduce a leak current propagating through the interface state, thereby making it possible to drive the HEMT 10 at high power.

In recent years, there has been a demand for the increased high-power driving of a high-power HEMT using a nitride semiconductor such as GaN. In order to meet such a demand, there is a need to further reduce the leak current generated in the high-power HEMT, especially a leak current generated between the gate and the drain.

SUMMARY

According to one aspect, a field-effect transistor includes a semiconductor multilayer structure including a carrier transport layer made of nitride semiconductor, a gate electrode formed on the semiconductor multilayer structure at a position corresponding to a channel region of the carrier transport layer, the gate electrode having a first sidewall surface on a first side thereof and a second sidewall surface on a second side thereof, an insulating film formed directly on the gate electrode to cover at least one of the first sidewall surface and the second sidewall surface, a first ohmic electrode formed on the first side of the gate electrode on the semiconductor multilayer structure, a second ohmic electrode formed on the second side of the gate electrode on the semiconductor multilayer structure, a passivation film including a first portion extending from the first ohmic electrode toward the gate electrode to cover a surface area of the semiconductor multilayer structure between the first ohmic electrode and the gate electrode and a second portion extending from the second ohmic electrode toward the gate electrode to cover a surface area of the semiconductor multilayer structure between the second ohmic electrode and the gate electrode, wherein the insulating film is in direct contact with at least the first and second portions of the passivation film, and has a composition different from that of the passivation film.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

Other objects and further features of the present invention will be apparent from the following detailed description when read in conjunction with the accompanying drawings, in which.

DESCRIPTION OF EMBODIMENTS

In the following, embodiments will be described with reference to the accompanying drawings.

First Embodiment

Figure 2:
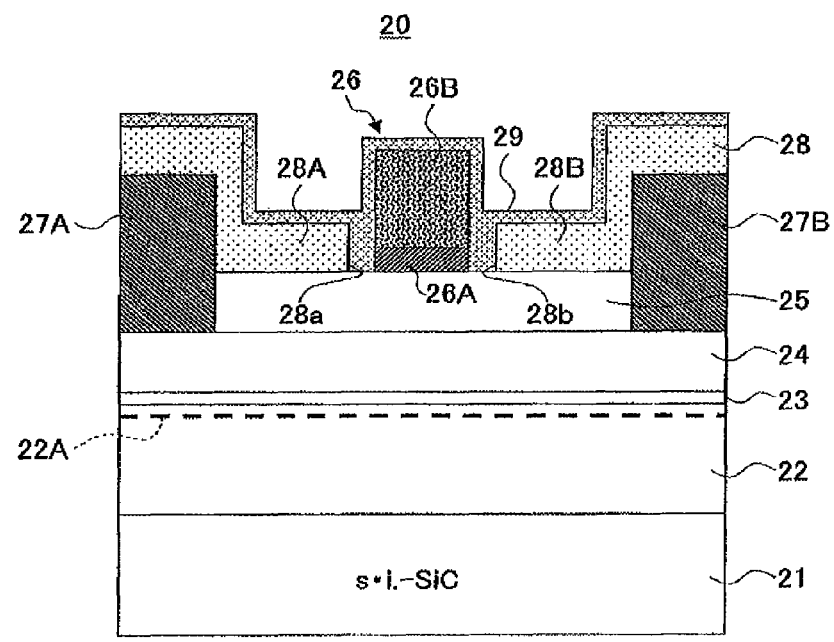
FIG. 2 is a drawing showing the configuration of a HEMT according to a first embodiment.

FIG. 2 is a drawing showing the configuration of a high-power field effect transistor 20 according to a first embodiment.

Referring to FIG. 2, the high-power field effect transistor 20 is a HEMT formed on a semi-insulating SiC substrate 21. An electron transport layer 22 made of undoped GaN is epitaxially formed to a thickness of 3 μm, for example, on the semi-insulating SiC substrate 21.

An electron supply layer 24 that is made of n-type AlGaN and doped with Si to an electron density of $5 \times 10^{18}$ cm$^{-3}$ is epitaxially formed to a thickness of 30 nm, for example, on the electron transport layer 22 with an undoped AlGaN spacer layer 23 having a thickness of 5 nm, for example, intervening therebetween. Further, an n-type GaN layer 25 is epitaxially formed on the electron supply layer 24. In conjunction with the forming of the electron supply layer 24, 2-dimensional electron gas (2DEG) 22A is formed in the electron transport layer 22 over the interface with the spacer layer 23.

Further, a gate electrode 26 that includes an Ni electrode film 26A providing a schottky junction and a low-resistance Au film 26B stacked thereon is formed on the n-type GaN layer 25. Further, ohmic electrodes 27A and 27B including a Ti film and an Al film stacked one over the other are formed as a source electrode and a drain electrode, respectively, to be in direct contact with the electron supply layer 24 in such a manner as to be spaced apart from the gate electrode 26.

In the HEMT 20, further, a passivation film 28 made of SiN or the like is formed to cover exposed surfaces of the n-type GaN layer 25. In this embodiment, the passivation film 28 includes a first passivation film portion 28A covering the ohmic electrode 27A and a second passivation film portion 28B covering the ohmic electrode 27B. An end surface 28a of the passivation film portion 28A that faces the gate electrode 26 is formed in such a manner as to be spaced apart by a distance no smaller than 0.5 nm and no larger than 500 nm from the sidewall surface of the gate electrode 26 that faces the ohmic electrode 27A. By the same token, an end surface 28b of the passivation film portion 28B that faces the gate electrode 26 is formed in such a manner as to be spaced apart by a distance no smaller than 0.5 nm and no larger than 500 nm from the sidewall surface of the gate electrode 26 that faces the ohmic electrode 27B.

In the present embodiment, further, an insulating film 29 made of aluminum oxide covering the sidewall surfaces of the gate electrode 26 is formed to a thickness no smaller than 0.5 nm and no larger than 500 nm so as to fill the gaps between the gate electrode 26 and the end surfaces 28a and 28b. The insulating film 29 formed in such a fashion seamlessly covers the upper surface and sidewall surfaces of the gate electrode 26.

In the illustrated example, the HEMT 20 is formed such that its gate length is about 1 μm and its gate width is about 100 μm.

Figure 3A:
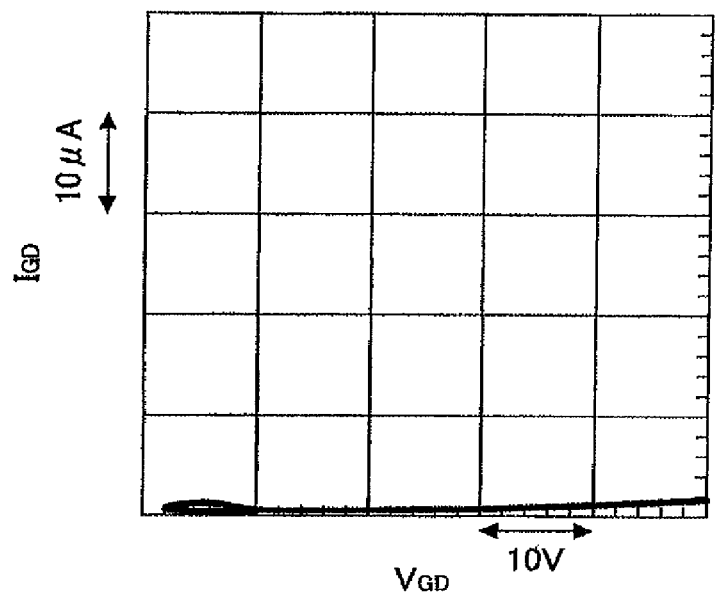
FIG. 3A is a drawing showing the gate-drain electric current characteristics of the HEMT shown in FIG. 2.

FIG. 3A is a drawing showing the gate-drain electric current characteristics of the HEMT shown in FIG. 2. In FIG. 3A, the horizontal axis represents the voltage applied between the gate electrode 26 and the ohmic electrode 27B to serve as a drain electrode, and the vertical axis represent a gate leak current flowing between the gate electrode 26 and the drain electrode 27B. In the figure, one tick mark in the horizontal axis corresponds to 10 V, and one tick mark in the vertical axis corresponds to 10 μA.

Referring to FIG. 3A, the leak current in the HEMT 20 is about 1 μm even when a voltage of 50 V is applied between the gate electrode 26 and the drain electrode 27B for the purpose of achieving high-power driving.

Figure 1:
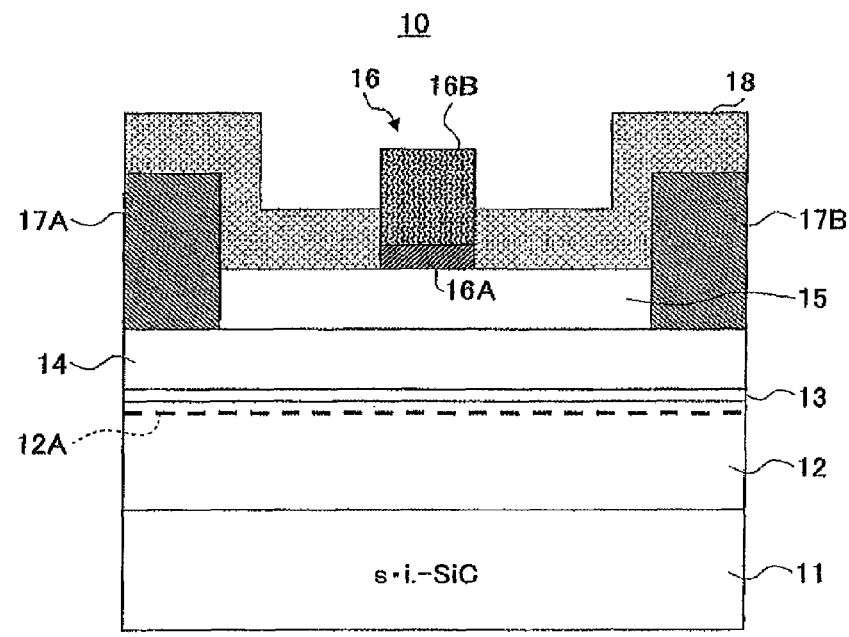
FIG. 1 is a drawing showing the configuration of a HEMT according to the related art.
Figure 3B:
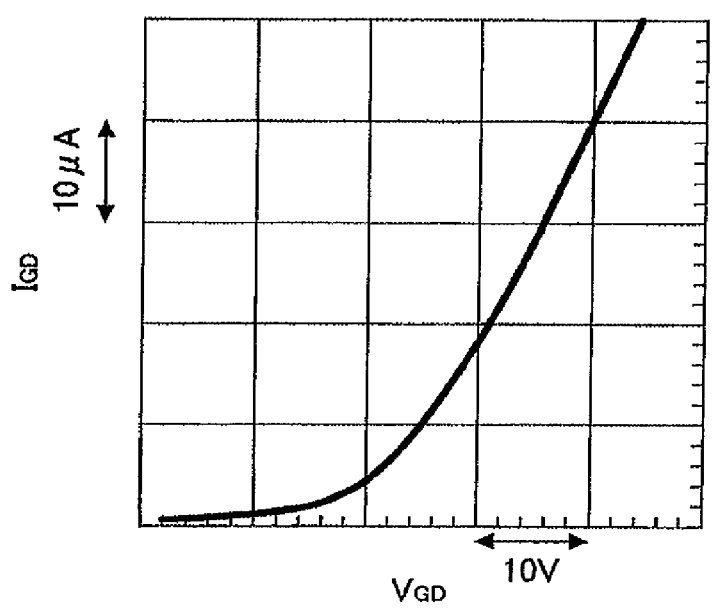
FIG. 3B is a drawing showing the gate-drain electric current characteristics of the HEMT shown in FIG. 1.

FIG. 3B is a drawing showing the same gate-leak-current characteristics as those of FIG. 3A as observed in the HEMT 10 of FIG. 1 that is formed to the same size as the HEMT 20 shown in FIG. 2. In FIG. 3B, the horizontal axis represents the voltage applied between the gate electrode 16 and the ohmic electrode 17B to serve as a drain electrode, and the vertical axis represent a gate leak current flowing between the gate electrode 16 and the drain electrode 17B. As in FIG. 3A, one tick mark in the horizontal axis corresponds to 10 V, and one tick mark in the vertical axis corresponds to 10 μA.

Referring to FIG. 3B, in the configuration in which no insulating film 29 is provided, the gate leak current starts rising when the gate-drain voltage exceeds 20 V, more or less. The gate leak current exceeds 50 μA when the gate-drain voltage reaches 50 V.

In the following, the process of manufacturing the HEMT 20 shown in FIG. 2 will be described with reference to FIGS. 4A through 4E.

Figure 4A:
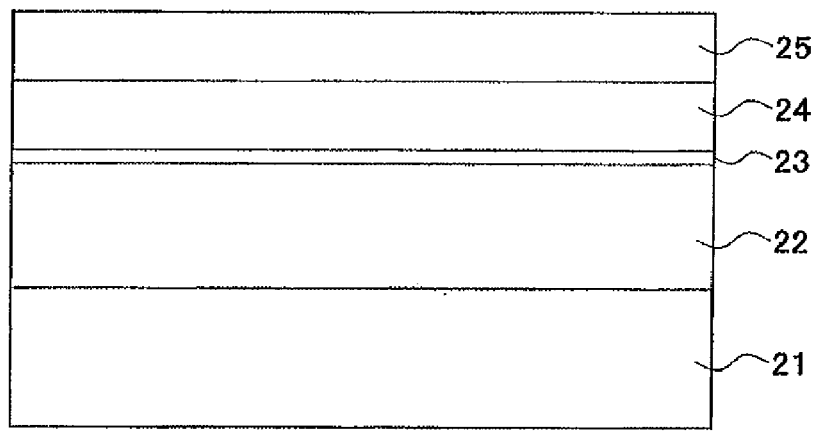
FIGS. 4A to 4F is a drawing showing a process of manufacturing the HEMT shown in FIG. 2.

Referring to FIG. 4A, the undoped GaN layer 22, the AlGaN spacer layer 23, the n-type AlGaN electron supply layer 24, and the n-type GaN layer 25 are successively formed on the SiC substrate 21 by use of the MOCVD method to the respective thicknesses as previously described, thereby creating a semiconductor multilayer structure.

Figure 4B:
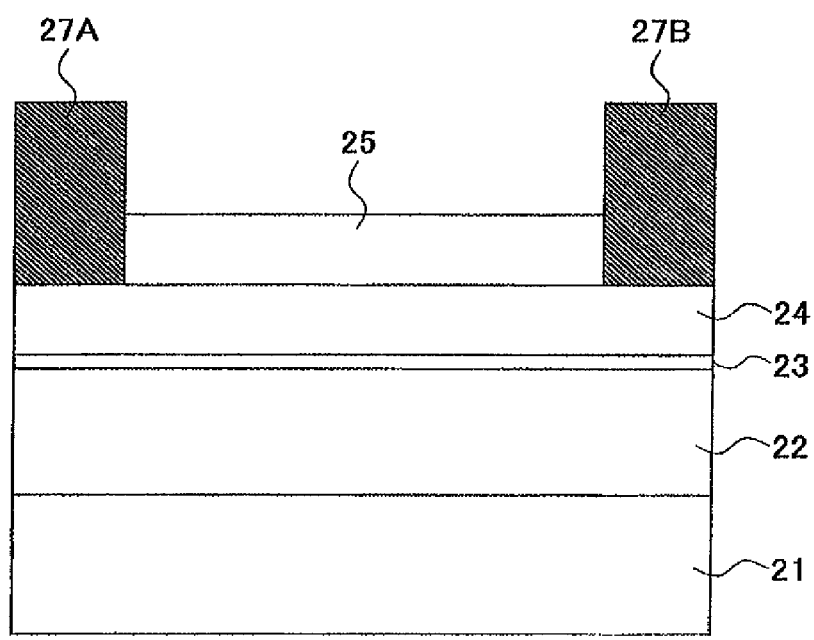

In the process step shown in FIG. 4B, openings are formed in the n-type GaN layer 25 by dry-etching using a chlorine gas to expose the n-type AlGaN electron supply layer 24 situated underneath in the semiconductor multilayer structure shown in FIG. 4A. The Ti/Al electrodes 27A and 27B are then formed by vapor deposition and lift-off to be in contact with the electron supply layer 24. The openings may be formed in such a manner as to slightly intrude into the electron supply layer 24. In the process step shown in FIG. 4B, further, heat treatment at about 600° C. is performed in nitrogen atmosphere thereby to make the electrodes 27A and 27B have ohmic contact with the electron supply layer 24.

Figure 4C:
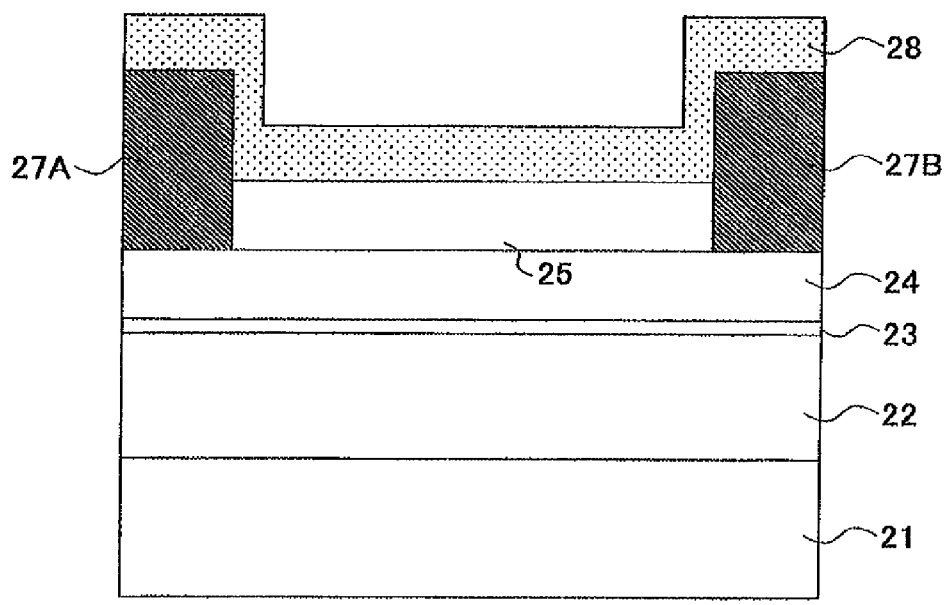

In the process step shown in FIG. 4C, the SiN passivation film 28 is formed on the structure shown in FIG. 4B by use of the plasma CVD method. In the process step shown in FIG. 4D, an opening 28C slightly larger than the gate length of the gate electrode 26 is formed in the SiN passivation film 28 by photolithography at a position corresponding to the position at which the gate electrode 26 is to be formed. As a result, the passivation film 28 is divided into the passivation film portion 28A defined by the end surface 28a and the passivation film portion 28B defined by the end surface 28b.

Figure 4D:
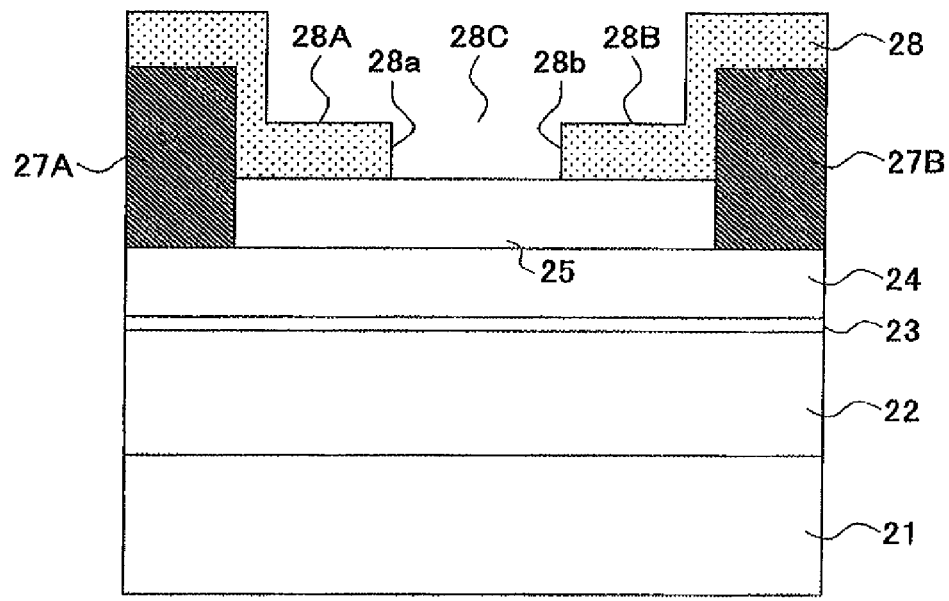
Figure 4E:
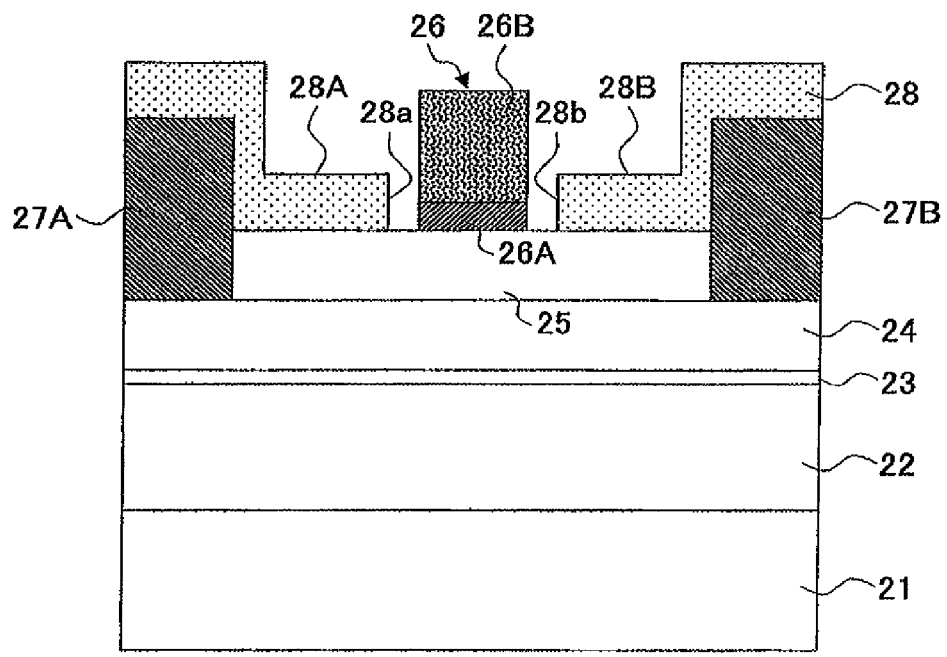

In the process step shown in FIG. 4E, an opening slightly smaller than the opening 28C is formed in the opening 28C, and, then, the gate electrode 26 including the Ni layer 26A and the Au layer 26B stacked one over the other is formed by vapor deposition and lift-off in such a manner as to be spaced apart from the end surfaces 28a and 28b of the passivation film 28.

Figure 4F:
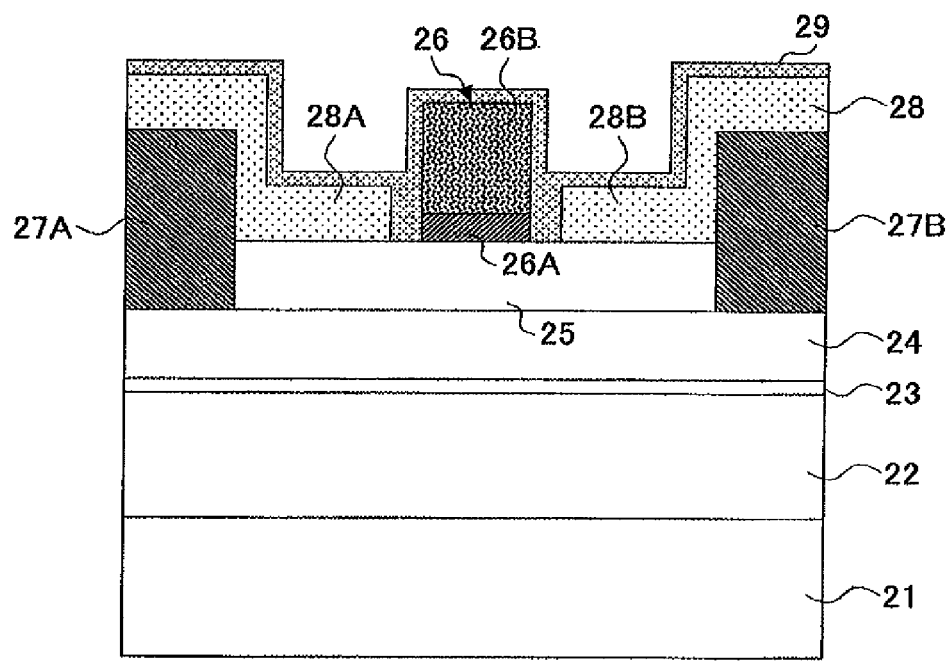

In the process step shown in FIG. 4F, the aluminum oxide film 29 is formed on the structure shown in FIG. 4E by the MOCVD method to fill the gap between the gate electrode 26 and either one of the passivation film portions 28A and 28B, thereby forming the HEMT 20 shown in FIG. 2.

Figure 5:
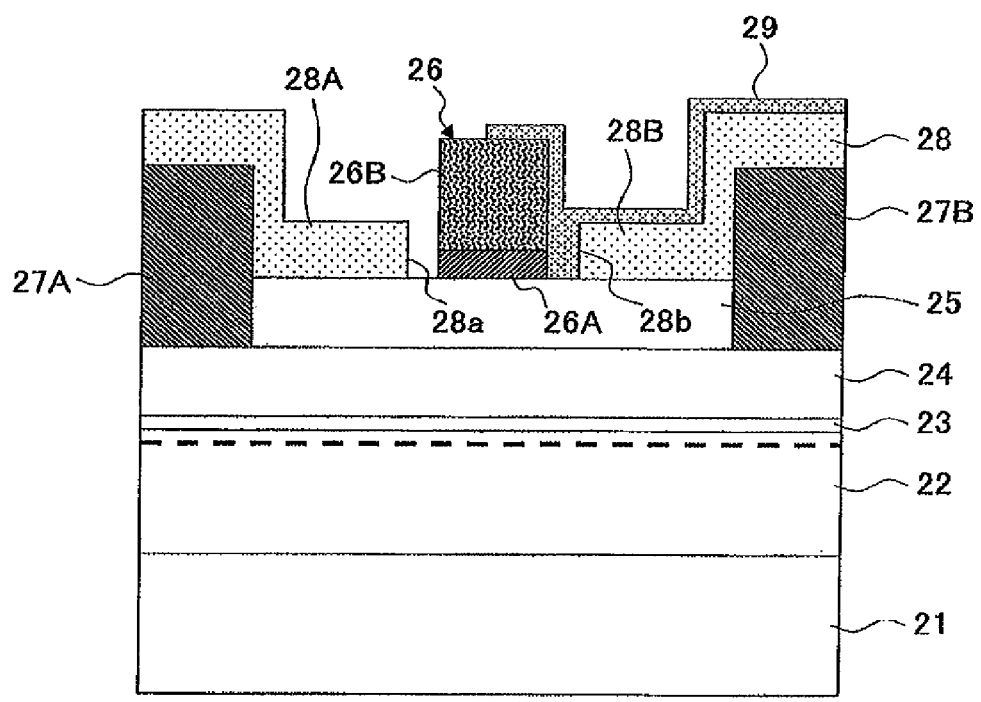
FIG. 5 is a drawing showing a variation of the HEMT shown in FIG. 2.

In the present embodiment, the step of depositing the insulating film 29 as shown in FIG. 4F may be performed by providing a mask, so that the insulating film 29 is formed to cover the sidewall surface of the gate electrode 26 only on the same side as the drain electrode 27B as shown in FIG. 5. Even when the sidewall surface of the gate electrode 26 is covered only on the same side as the drain electrode 27B, the effect of suppressing a gate leak current as described in connection with FIGS. 3A and 3B is obtained.

Figure 6:
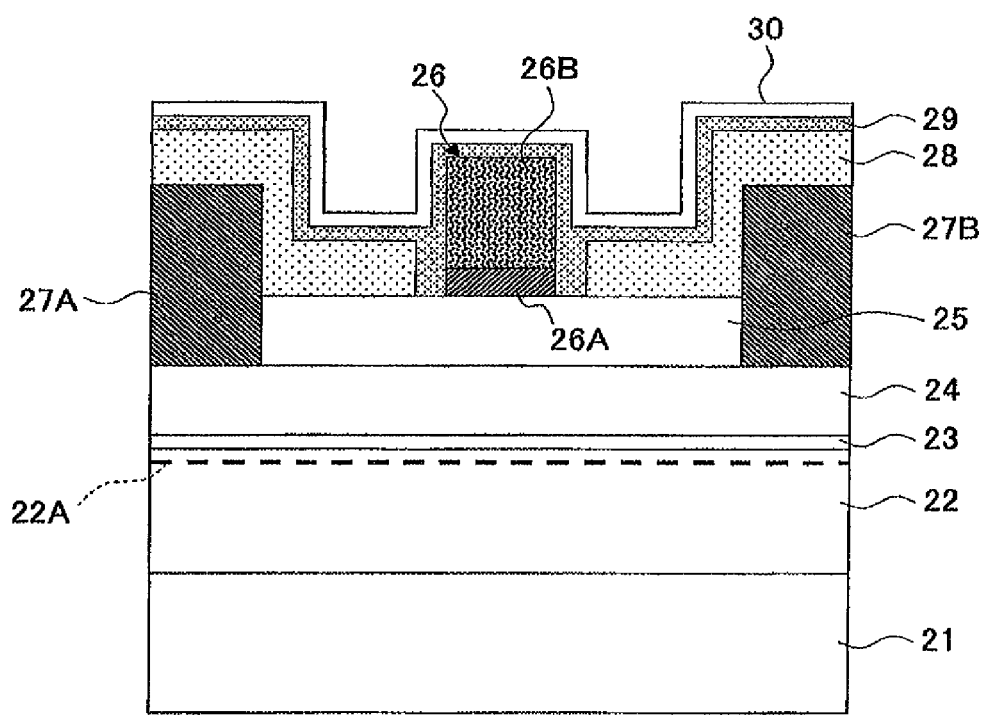
FIG. 6 is a drawing showing another variation of the HEMT shown in FIG. 2.

In the HEMT 20 shown in FIG. 2, further, an $SiO_2$ film 30 may be formed on the insulating film 29 as shown in FIG. 6 so as to form a multilayer film inclusive of an SiN film and an $SiO_2$ film stacked one over the other.

In the configuration described above, the insulating film 29 is not limited to aluminum oxide, and may properly be aluminum nitride, gallium oxide, nickel oxide, nickel fluoride, or copper oxide. As shown in FIG. 6, a multilayer film including films made of these named materials may as well be used. Moreover, the passivation film is not limited to SiN, and may properly be $SiO_2$ or the like.

In the present embodiment, further, the electron transport layer 22 is not limited to GaN, and may properly be another nitride semiconductor such as AlN or InN, or a mixed crystal of these.

Further, the semiconductor multilayer structure is not limited to the structure disclosed in the present embodiment, and may be any structure such as a structure having no GaN cap layer as long as it has a HEMT structure.

In the process step shown in FIG. 4D, moreover, the gate electrode 26 may be formed in advance, followed by forming a sidewall insulating film on the sidewall surfaces of the gate electrode 26 by using an insulating film such as $SiO_2$ having an etching selectivity different from that of the SiN passivation film 28. Such sidewall insulating film may be removed by etching after the passivation film 28 is formed, thereby forming the opening 28C in a self-aligned manner.

In the present embodiment, further, a conductive SiC substrate or sapphire substrate may be used as the substrate 21 in place of a semi-insulating SiC substrate.

Second Embodiment

Figure 7:
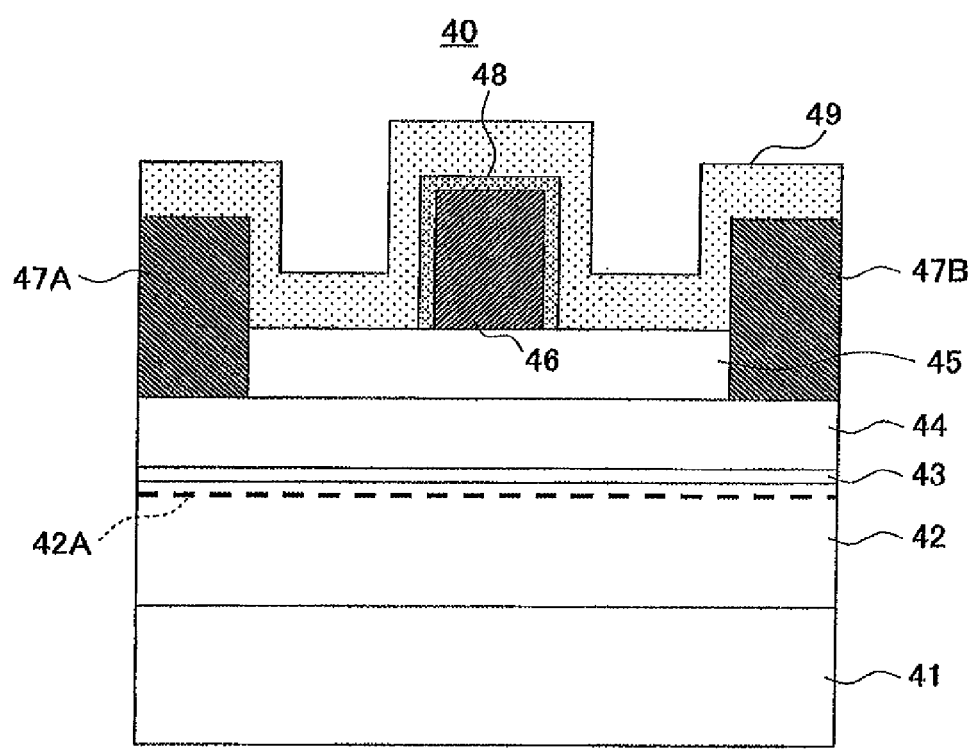
FIG. 7 is a drawing showing the configuration of a HEMT according to a second embodiment.

FIG. 7 is a drawing showing the configuration of a high-power field effect transistor 40 according to a second embodiment.

Referring to FIG. 7, the high-power field effect transistor 40 is a HEMT formed on a semi-insulating SiC substrate 41. An electron transport layer 42 made of undoped GaN is epitaxially formed to a thickness of 3 μm, for example, on the semi-insulating SIC substrate 41.

An electron supply layer 44 that is made of n-type AlGaN and doped with Si to an electron density of $5 \times 10^{18}$ $cm^{-3}$ is epitaxially formed to a thickness of 30 nm, for example, on the electron transport layer 42 with an undoped AlGaN spacer layer 43 having a thickness of 5 nm, for example, intervening therebetween. Further, an n-type GaN layer 45 is epitaxially formed on the electron supply layer 44. In conjunction with the forming of the electron supply layer 44, 2-dimensional electron gas (2DEG) 42A is formed in the electron transport layer 42 over the interface with the spacer layer 43.

Further, a gate electrode 46 made of an Ni electrode film providing a schottky junction is formed on the n-type GaN layer 45. Further, ohmic electrodes 47A and 47B including a Ti film and an Al film stacked one over the other are formed as a source electrode and a drain electrode, respectively, to be in direct contact with the electron supply layer 44 in such a manner as to be spaced apart from the gate electrode 46.

In the HEMT 40 described above, an insulating film 48 made of a nickel oxide film formed by oxidizing the Ni electrode 46 is formed to a film thickness of 0.05 to 500 nm to seamlessly cover the upper surface and sidewall surfaces of the gate electrode 46.

In such a structure, the n-type GaN layer 45 is exposed between the gate electrode 48 and the source electrode 47A as well as between the gate electrode 48 and the drain electrode 47B. The exposed surfaces of the GaN layer 45 are covered by a passivation film 49 made of SiN or $SiO_2$ that seamlessly covers everything from the source electrode 47A to the drain electrode 47B, including the gate electrode 48.

With the provision of the insulating film 48, this structure can suppress a gate leak current in the same manner as described in connection with FIGS. 3A and 3B In the following, the process of manufacturing the HEMT shown in FIG. 7 will be described with reference to FIGS. 8A through 8E.

First, the same process steps as shown in FIGS. 4A and 4B are performed to form a multilayer structure in which the semiconductor layers 42 through 45 are stacked one over another on the SiC substrate 41. After the source and drain electrodes 47A and 47B are formed, the gate electrode 46 is formed by vapor deposition and lift-off in the process step shown in FIG. 8A.

Figure 8A:
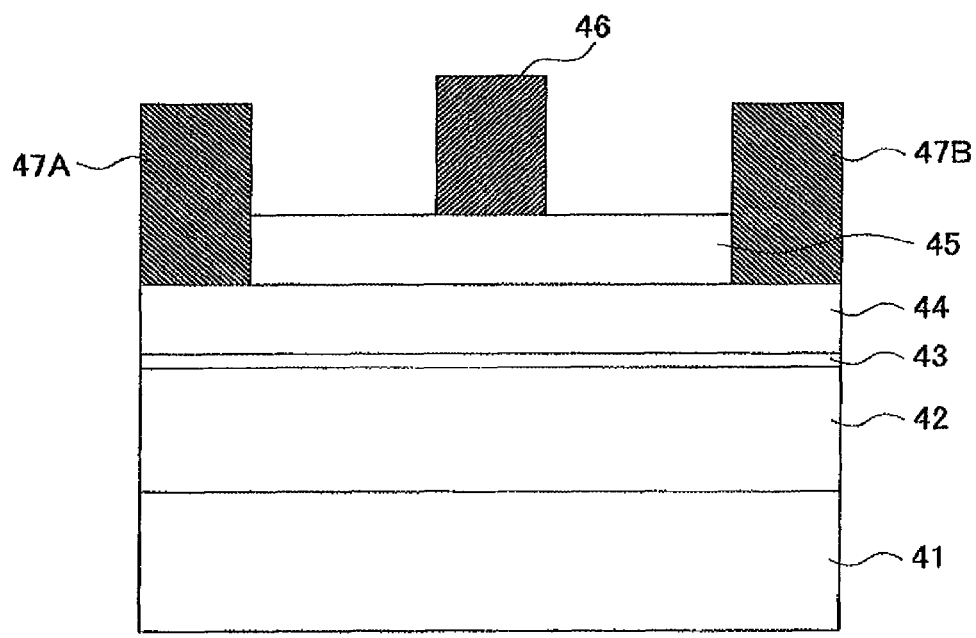
FIGS. 8A to 8C is a drawing showing a process of manufacturing the HEMT shown in FIG. 7.
Figure 8B:
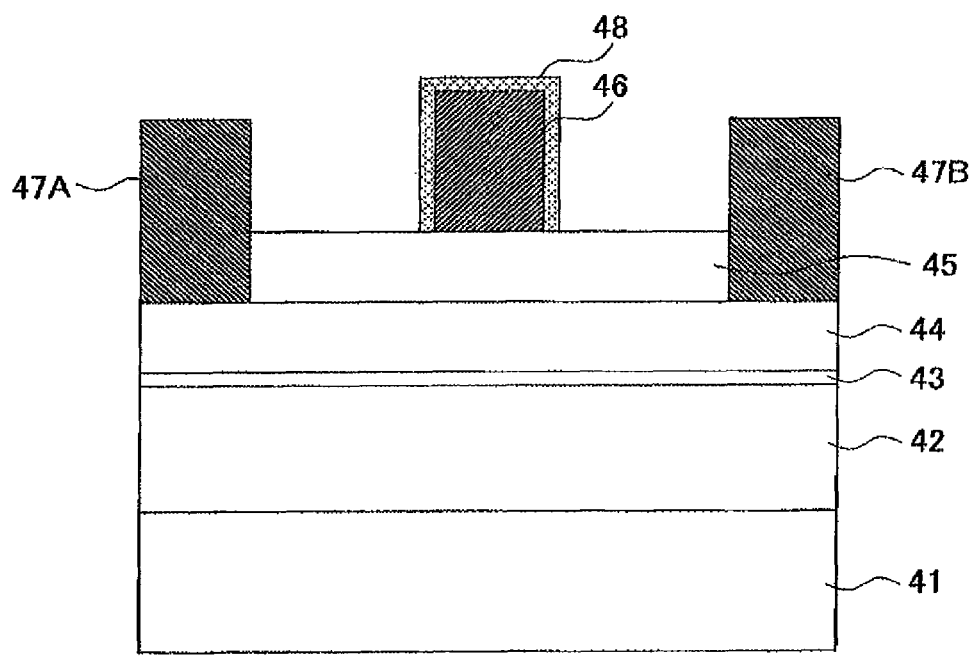

Then, in the process step shown in FIG. 8B, heat treatment in an oxygen atmosphere or oxygen plasma treatment is performed with respect to the structure shown in FIG. 8A, thereby forming an oxide film as the insulating film 48 in the upper surface and sidewall surfaces of the gate electrode 46. The insulating film 48 formed in such a fashion includes as its constituent element a metal element that constitutes the gate electrode 46. During the oxidation process or oxygen plasma treatment, the source electrode 47A and the drain electrode 47B are covered by a mask pattern (not shown) such as an $SiO_2$ film.

Figure 8C:
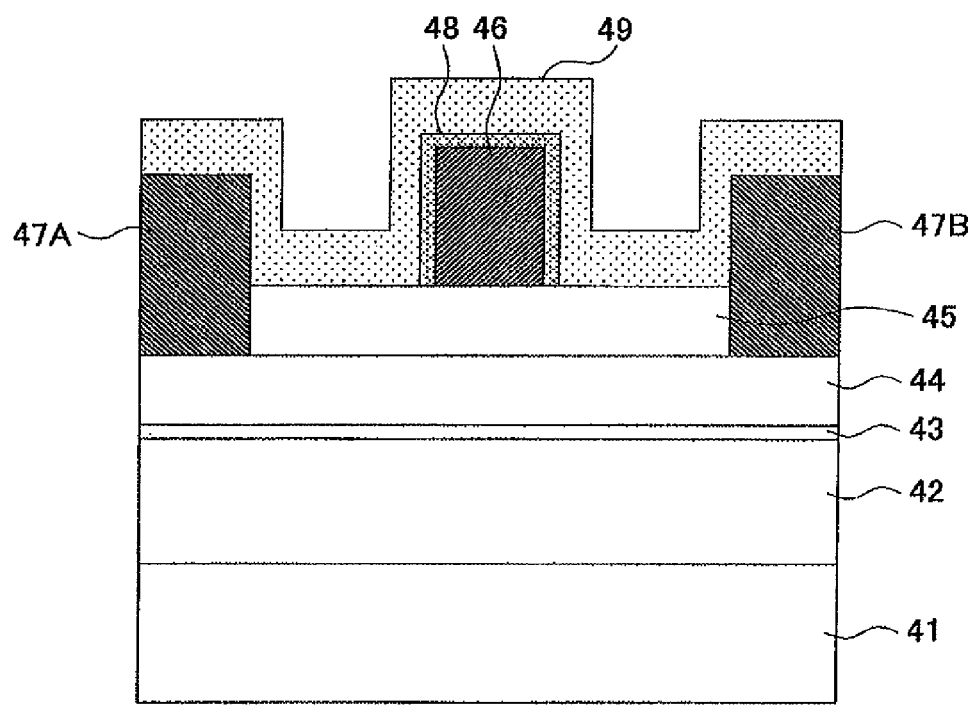

In the process step shown in FIG. 8C, the mask pattern is removed, and, then, an SiN film or $SiO_2$ film is formed as the passivation film 49 by the plasma CVD method.

Figure 9:
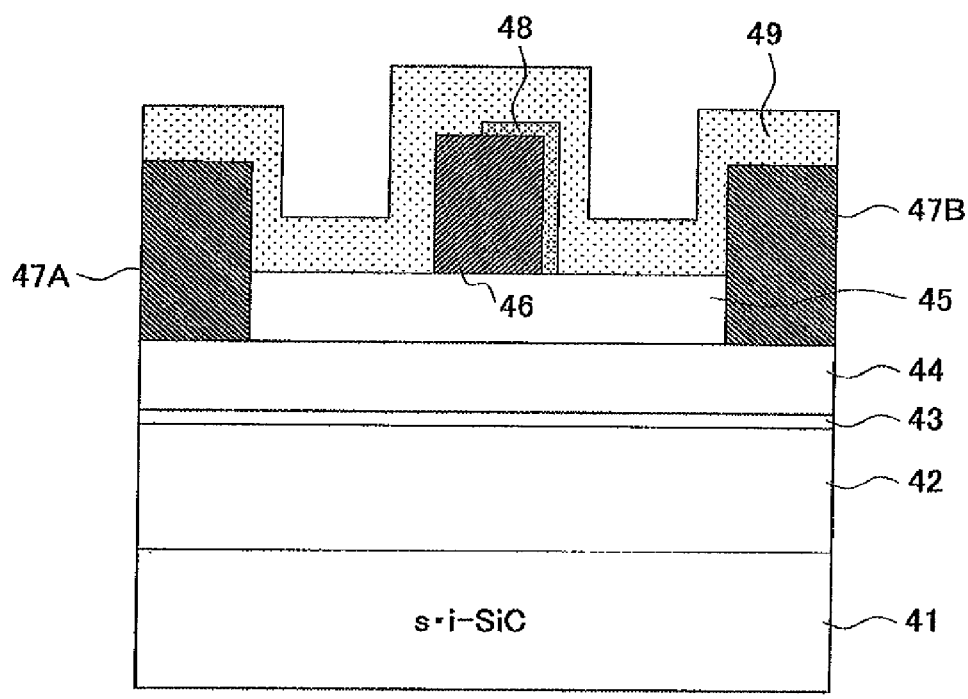
FIG. 9 is a drawing showing a variation of the HEMT shown in FIG. 7.

In the present embodiment, the gate electrode 46 may be partially covered by a mask pattern during the formation of the insulating film 48 on the gate electrode 46. As shown in FIG. 9 illustrating a variation, thus, the insulating film 48 may be formed on the sidewall surface of the gate electrode 46 only on the same side as the drain electrode 47B.

The insulating film 48 is not limited to an oxide film previously described, and may properly be a nitride film or fluoride film. Such a nitride film or fluoride film may be formed by exposing the gate electrode 46 to nitrogen plasma or fluorine plasma, respectively.

Figure 10:
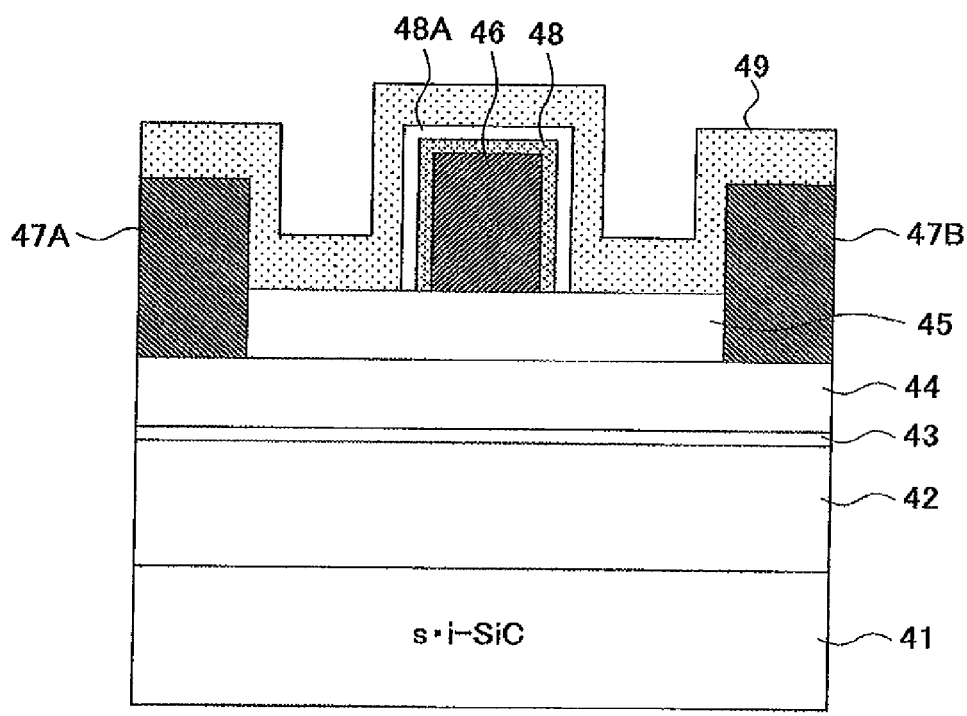
FIG. 10 is a drawing showing another variation of the HEMT shown in FIG. 7.

As shown in FIG. 10 illustrating a variation, another insulating film 48A may be formed on the insulating film 48 by an oxidization treatment, a nitriding treatment, a fluorination treatment, or the CVD method, thereby forming a multilayer film.

In the present embodiment, the electron transport layer 42 is not limited to GaN, and may properly be another nitride semiconductor such as AlN or InN, or a mixed crystal of these.

Further, the semiconductor multilayer structure is not limited to the structure disclosed in the present embodiment, and may be any structure such as a structure having no GaN cap layer as long as it has a HEMT structure.

In the present embodiment, further, a conductive SiC substrate or sapphire substrate may be used as the substrate 41 in place of a semi-insulating SiC substrate.

In the present embodiment, the gate electrode 46 is not limited to Ni, and may properly be a metal film such as Cu, Pd, or Pt providing a schottky junction in conjunction with a nitride semiconductor film.

Although the above description has been provided with reference to an example in which the semiconductor device is a HEMT, the technology of the present disclosures is applicable to other types of compound semiconductor devices.

In the technology of the present disclosures, a high-power field-effect transistor having a carrier transport layer made of a nitride semiconductor is configured such that at least one of the sidewall surfaces of the gate electrode on the same side as the drain electrode is covered with an insulating film having different composition from that of the passivation film, thereby effectively suppressing a gate leak current that would flow between the gate electrode and the drain region.

Further, the present invention is not limited to these embodiments, but various variations and modifications may be made without departing from the scope of the present invention.

What is claimed is:

1. A compound semiconductor device, comprising:

a substrate;

a semiconductor multilayer structure including a carrier transport layer made of nitride semiconductor formed above the substrate;

a gate electrode, a source electrode, and a drain electrode formed above the semiconductor multilayer structure;

an insulating film formed between the gate electrode and the source electrode and between the gate electrode and the drain electrode above the semiconductor multilayer structure, the insulting film having an opening between the gate electrode and the source electrode and between the gate electrode and the drain electrode; and an alumina film embedded into the opening, wherein the insulating film is not in contact with the gate electrode, and wherein the alumina film isolates the gate electrode from the insulating film and is absent under the gate electrode.

2. The compound semiconductor device as claimed in claim 1, wherein the alumina film has a thickness larger than or equal to 0.5 nm and smaller than or equal to 500 nm.

3. The compound semiconductor device as claimed in claim 1, wherein the alumina film is in contact with a sidewall of the gate electrode.

4. The compound semiconductor device as claimed in claim 1, wherein the insulating film is made of SiN.

5. The compound semiconductor device as claimed in claim 1, wherein the carrier transport layer is made of GaN.

* * * * *